United States Patent
Rodder et al.

[11] Patent Number: 6,124,627
[45] Date of Patent: Sep. 26, 2000

[54] LATERAL MOSFET HAVING A BARRIER BETWEEN THE SOURCE/DRAIN REGION AND THE CHANNEL REGION USING A HETEROSTRUCTURE RAISED SOURCE/DRAIN REGION

[75] Inventors: Mark S. Rodder, University Park; William U. Liu, Plano, both of Tex.

[73] Assignee: Texas Instruments Incorporated, Dallas, Tex.

[21] Appl. No.: 09/334,991

[22] Filed: Jun. 17, 1999

Related U.S. Application Data

[62] Division of application No. 09/205,151, Dec. 3, 1998.
[51] Int. Cl.[7] .................................................. H01L 29/40
[52] U.S. Cl. ........................ 257/616; 257/751; 438/300
[58] Field of Search ........................ 257/616, 77, 751; 438/300

[56] References Cited

U.S. PATENT DOCUMENTS

| | | | |
|---|---|---|---|
| 3,794,516 | 2/1974 | Engeler et al. | 257/77 |
| 5,103,285 | 4/1992 | Furumura et al. | 257/77 |
| 5,134,447 | 7/1992 | Ng et al. | 257/751 |
| 5,168,072 | 12/1992 | Moslehi | 257/327 |
| 5,242,847 | 9/1993 | Ozturk et al. | 437/41 |
| 5,280,185 | 1/1994 | Aronowitz et al. | 257/607 |
| 5,475,244 | 12/1995 | Koizumi | 257/192 |
| 5,710,450 | 1/1998 | Chau et al. | 257/344 |
| 5,726,081 | 3/1998 | Lin et al. | 438/163 |
| 5,734,181 | 3/1998 | Ohba et al. | 257/77 |
| 5,818,100 | 10/1998 | Grider et al. | 257/616 |
| 5,840,604 | 11/1998 | Yoo et al. | 438/230 |
| 5,843,826 | 12/1998 | Hong | 438/300 |
| 5,872,039 | 2/1999 | Imai | 438/300 |
| 5,904,516 | 5/1999 | Park | 438/300 |
| 5,967,794 | 10/1999 | Kodama | 438/300 |

OTHER PUBLICATIONS

1990 IEEE, Symposium on VLSI Technology, "A New Structural Approach for Reducing Hot Carrier Generation in Deep Submicron MOSFET's," pp. 43–44, (A1F. Tasch, Hyungsoon Shin and Christine M. Maziar).

*Primary Examiner*—David Hardy
*Attorney, Agent, or Firm*—Jacqueline J. Garner; W. James Brady, III; Frederick J. Telecky, Jr.

[57] ABSTRACT

A MOSFET (100) having a heterostructure raised source/drain region and method of making the same. A two layer raised source drain region (106) is located adjacent a gate structure (112). The first layer (106a) is a barrier layer comprising a first material (e.g., SiGe, SiC). The second layer (106b) comprises a second, different material (e.g. Si). The material of the barrier layer (106a) is chosen to provide an energy band barrier between the raised source/drain region (106) and the channel region (108).

4 Claims, 3 Drawing Sheets

LATERAL MOSFET HAVING A BARRIER BETWEEN THE SOURCE/DRAIN REGION AND THE CHANNEL REGION USING A HETEROSTRUCTURE RAISED SOURCE/DRAIN REGION

This application is a Divisional of Ser. No. 09/205,151 filed Dec. 3, 1998.

CROSS-REFERENCE TO RELATED APPLICATIONS

The following co-assigned co-pending patent applications are related to the invention and are hereby incorporated by reference:

|   | Serial No. | Filed | Inventors |
| --- | --- | --- | --- |
| B | 08/957,503 | 10/24/97 | Rodder et al. |
| B | 08/957193 | 10/24/97 | Rodder et al. |
| B | 08/205,346 | 12/3/98 | Rodder |

FIELD OF THE INVENTION

This invention generally relates to semiconductor devices and processes and more specifically to a lateral MOSFET structures having raised source/drain regions.

BACKGROUND OF THE INVENTION

As semiconductor devices are scaled to smaller dimensions, generally in the sub-0.1 $\mu$m region, it is highly desirable and generally necessary to fabricate such devices with smaller junction depths and a controllable pocket implant adjacent to the shallow junctions to reduce short-channel effects (i.e., reduced threshold voltage rolloff) and reduced in gate length. The pocket implant is a doped implanted region which is oppositely doped to the junction regions. A problem that arises with such small geometries is that, with very short channel lengths, the implant profile cannot be adequately controlled and shallow junctions and/or well controlled thicknesses of doped layers generally cannot be formed by simple implantation.

An example of such a prior art device is shown in FIGS. 1a and 1b wherein there is shown a semiconductor substrate 1, for example doped p-type, having a gate electrode 3 spaced from the substrate by a dielectric layer 5. Shallow doped extension regions 7 (denoted herein as drain extension regions and, for example, doped n-type) may be formed on each side of the gate electrode 3 with or without sidewall dielectric spacers 2 provided adjacent to the gate electrode 3 prior to formation of the doped extension regions 7. Pocket regions 9 of doping type opposite (e.g., p-type) to that of the drain extension regions 7 may be formed by means of implantation prior to or after formation of the drain extension regions 7. Typically, the pocket region 9 extends beyond the drain extension regions 7 in both the lateral and vertical directions, whereby a large bottomwall capacitance can result due to the n/p junction region formed at the bottom of the drain extension region due to the overlap with the pocket region 9 over the entire active area. The doping in the pocket region 9 from the pocket process may be of higher concentration than the doping of the substrate 1.

To reduce this bottomwall capacitance over the entire active area, a deeper source/drain region 10 (in this example, n-type) can be formed after formation of sidewall spacers 12 so that the bottomwall overlap of the deeper source/drain region 10 and the pocket regions 9 is eliminated, thus reducing the bottomwall capacitance in these regions as shown in FIG. 1b.

When dealing with sub-0.1 $\mu$m geometries, the gate width dimensions are in the 200 to 900 angstrom region, thereby leaving a channel region on the order of about 100–800 angstroms. Implants cannot be adequately controlled in accordance with the prior art semiconductor fabrication techniques when such small dimensions are involved.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with a raised source/drain n-type MOSFET for the deep submicron regime (i.e., tenth-micron and below). Those of ordinary skill in the art will realize that the benefits of the invention are also applicable to other MOSFET structures and that the benefits are not limited to the deep sub-micron regime.

Figure 1A:
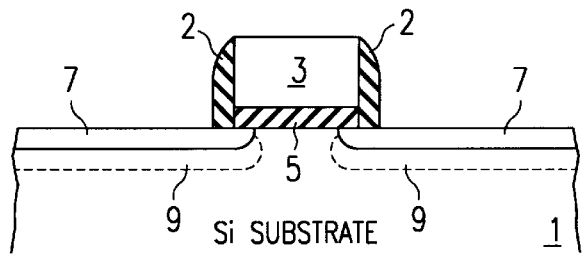
FIGS. 1a–1b are a cross-sectional diagrams of a prior art MOSFET structure.
Figure 1B:
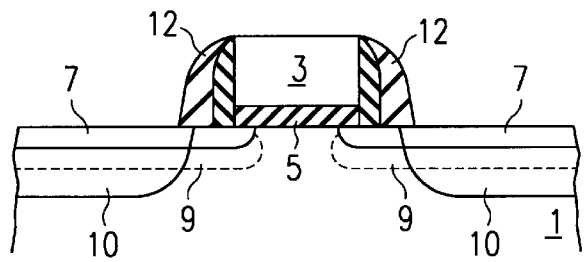
Figure 2:
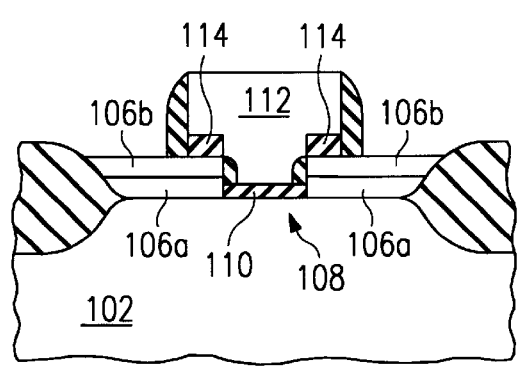
FIG. 2 is a cross-sectional diagram of a MOSFET forming according to a first embodiment of the invention.

A raised source/drain MOSFET 100 formed according to a first embodiment of the invention is shown in FIG. 2. MOSFET 100 is in part a lateral conduction MOSFET formed in substrate 102. Raised source/drain regions 106 comprise two distinct materials. The upper layer 106b forms the source/drain of the MOSFET. Barrier layer 106a is located between upper layer 106b and the substrate. Barrier layer 106a provides a barrier between the source/drain and the channel region 108.

Channel doping may be substantially limited by means of self-alignment to the immediate channel region 108. This reduces the source/drain junction capacitance over the traditional methods of (a) implanting the entire active area for the channel implant including the source/drain junction regions, or (b) using non-self-aligned but more localized channel implant.

A gate dielectric 110 separates the gate electrode 112 from the channel region 108 and raised source/drain regions 106. Gate dielectric 110 may comprise any appropriate material. Conventionally, a thermally grown oxide, oxynitride, or deposited gate insulator is used. Gate electrode 112 preferably comprises a low resistance material such as metal or doped polysilicon. However, other conductive materials, such as amorphous silicon, a non-crystalline silicon, a composite metal-polysilicon or metal—metal, may alternatively be used. Examples include aluminum over titanium-nitride and tungsten over titanium nitride. Gate electrode 112 is also preferably salicided to further reduce sheet resistance if polysilicon is used. If desired, gate electrode 112 may be formed into a T-gate structure as shown in FIG. 2. A T-gate structure is not required to practice the invention, but offers further reduction in gate sheet resistance.

An insulator layer 114 separates the raised source/drain regions 106 from the overlying portions of the T-gate structure 112. The material of insulator layer 114 is chosen such that a disposable gate material used during processing may be etched selectively with respect to dielectric layer 114. This will be described further below. For example, insulator layer 114 may comprise an oxide. The thickness of insulator layer 114 may be tailored to allow for a low gate-to-drain capacitance between the raised source/drain regions 106 and the overlying portion of the T-gate structure 112.

Figure 4:
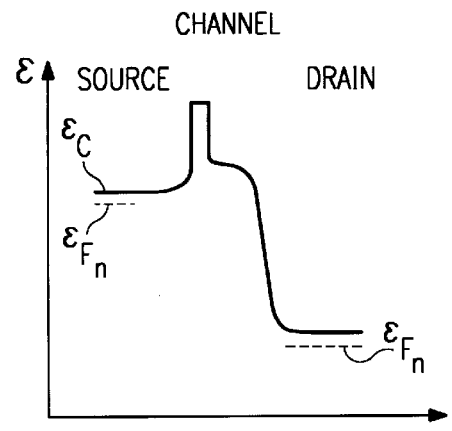
FIG. 4 is a energy band diagram for a MOSFET according to the invention.
Figure 3A:
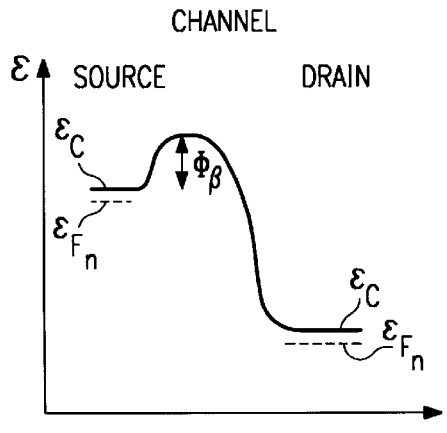
FIGS. 3a–3b are energy band diagrams for prior art MOSFETS.
Figure 3B:
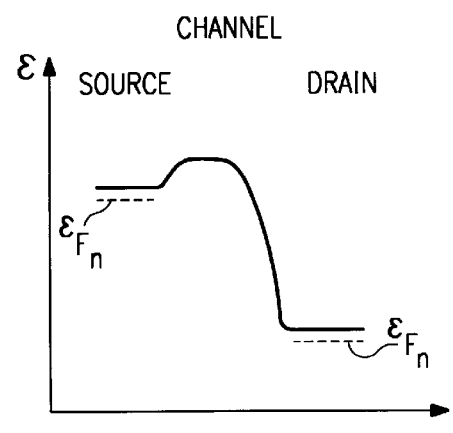

Band diagrams for a conventional n-type MOSFET are shown in FIGS. 3A–3B for illustrative purposes. FIG. 3A shows the "OFF" state and FIG. 3B shows the "ON" state. A key issue to minimizing the "OFF" state leakage is to achieve a high potential barrier $\Phi_B$ at the source side in the "OFF" state. The barrier layer 106a creates the desired high potential barrier. An energy band diagram for the "OFF" state of a MOSFET according to one embodiment of the invention is shown in FIG. 4. The barrier 117 caused by layer 106a prevents leakage current from source to drain. Any band offset, however, small, will be helpful to reduce the leakage current. However, a band offset of at least 0.1 eV–0.3 eV will result in a more noticeable change in leakage current. While FIG. 4 is shown with region 106a creating an energy barrier between region 106b and the channel region, other embodiments may be such that the channel region itself creates an energy barrier for carrier transport from region 106a itself.

The barrier is formed in a region grown above the substrate in which the channel region is formed. Thus, the barrier is formed vertically while channel conduction is in part still lateral. The gate electrode can modulate both the vertical transport (from layer 106b through layer 106a and into the substrate) and the lateral transport through the substrate under the raised source/drain regions 106 into the channel region. The barrier layer 106a can comprise a material different from both the substrate and the upper layer 106b.

The invention according to this embodiment still allows lateral scaling of the MOSFET without the difficulty of forming a lateral barrier in the substrate itself. The barrier layer 106a is formed above the substrate and has a well-defined barrier thickness.

A variety of materials may also be used for the raised source/drain materials. In fact, the upper layer 106b need not necessarily be a crystalline material. The materials for raised source/drain layers 106a–106b are chosen such that a barrier such as that shown in FIG. 4 occurs in the energy band diagram for the MOSFET or the materials are chosen such that there is a barrier from region 106a to the channel region. The barrier layer 106a should be capable of being modulated by the gate electrode. Barrier layer 106a may also comprise a combination of barriers that can be modulated by a gate electrode. Examples of possible materials combinations for layers 106b/106a are as follows: Si/SiC, Si/SiGe, or Si/CaF2.

Figure 5A:
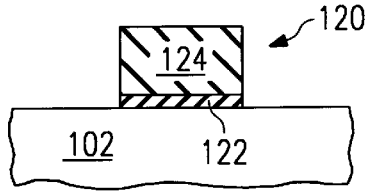
FIGS. 5A–5H are cross-sectional diagrams of the MOSFET of FIG. 2 during various stages of fabrication.

A method for forming MOSFET 100 according to the first embodiment of the invention will now be described in conjunction with FIGS. 5A–5H. Referring to FIG. 5A, a disposable gate 120 is formed on an active area of substrate 102 over the region where the channel region of MOSFET 100 is desired. Several disposable gate processes are known in the art. An exemplary disposable gate process is discussed herein. Disposable gate 120 comprises two materials, first material 122 and second material 124. The first and second materials 122 and 124 are chosen so that they may be selectively etched with respect to each other. For example, they may comprise oxide and nitride respectively. The first material is also chosen so that it may be etched very selectively with respect to silicon to avoid damaging the channel region upon its removal. To form disposable gate 120, the first material 122 is deposited over substrate 102. The second material 124 is then deposited over the first material 122. Both materials (122,124) are then patterned and etched leaving the structure shown in FIG. 5A.

Figure 5B:
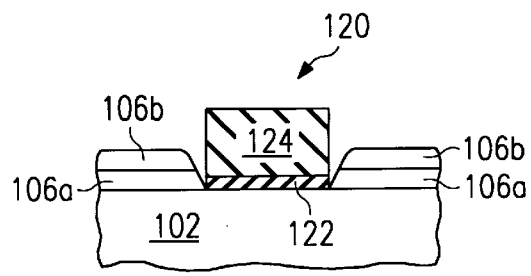

Next, raised source/drain regions 106a&b may be formed as shown in FIG. 5B. Barrier layer 106a may be formed by selective epitaxy, followed by the selective epitaxy of upper layer 106b. For example, raised source/drain regions 106b/106a may be formed by varying the Ge content during a selective epitaxy process with higher concentrations of Ge at the beginning forming a SiGe barrier layer 106a tapering off to form a Si upper layer 106b. Formation of the raised source/drain regions depends on the materials used. In a preferred embodiment, upper layer 106b comprises silicon and barrier layer 106a comprises silicon carbide. In this embodiment, both layers may be formed by selective epitaxial deposition using the disposable gate structure 120 as a mask. Alternatively, layers 106a&b may be deposited, patterned and etched to form a region substantially over the source/drain area only. If epitaxial deposition is used, angled faceting of the epitaxially formed raised source/drain region 106 at the edge of the disposable gate 120 may occur. The degree of faceting may be partially controlled by adjusting process parameters of the cleaning and deposition processes.

Raised source/drain region 106a/106b are preferably doped in the following manner. For a PMOS device with, for example a Si/SiGe combination, the p+ dopants are introduced into the upper Si layer 106b and may partially extend into the barrier layer 106b. However, the dopants should not extend into the underlying channel region. For NMOS devices with, for example a Si/SiC combination, the n+ dopants are introduced into the upper Si layer 106b, but are not substantially found in the SiC barrier layer 106a. Dopants may be introduced by means such as in-situ doping or by controlled implantation or diffusion from an overlying dopant source. A portion of the raised source/drain regions 106 may additionally be doped after deposition by means such as described later.

If desired, a selected portion of the upper layer 106b may be cladded after formation. The cladding forms a low resistance material over the raised source/drain regions by means of e.g., salicidation or formation of a metal layer over a portion of the raised source/drain regions 106. Cladding prior to the formation of the gate dielectric and gate electrode may reduce the heat treatments seen by the gate dielectric and gate electrode.

Figure 5C:
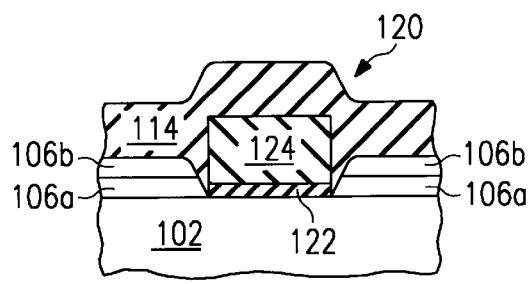
Figure 5D:
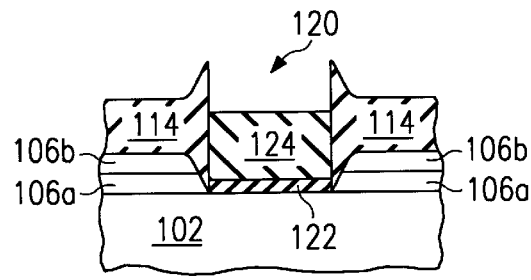

Referring to FIG. 5C, an insulator material 114 is deposited over the structure. Insulator material 114 is chosen such that it may be etched selectively with respect to the second material 124 of disposable electrode 120. For example, if the second material 124 is nitride, insulator material 114 may comprise an oxide. Insulator material 114 is then removed to expose disposable gate 120, as shown in FIG. 5D. For example, an etch-back process or chemical-mechanical polishing (CMP) may be used. Alternatively, a patterned etch of insulator material 114 in the proximity of the disposable gate 120 may be used. Insulator layer 114 covers raised source/drain regions 106, but not the surface of disposable gate 120.

Figure 5E:
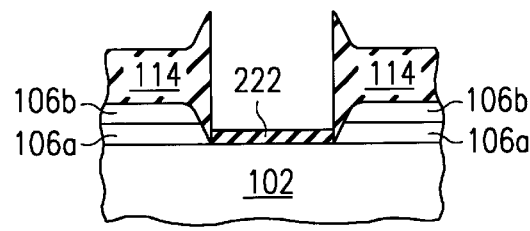

Next, the second material 124 of disposable gate 120 is selectively removed, as shown in FIG. 5E. Because the composition of first material 122, second material 124 and insulator material 114 are chosen such that second material 124 may be selectively etched with respect to both insulator material 114 and first material 122, insulator layer 114 and first material 122 are not appreciably removed during the removal of second material 124. After the removal of second material 124, first material 122 is removed. Again, due to the judicious choice of materials and/or etch processes, first material 122 is removed without etching into the substrate 102. Severe damage to the channel region 108 of substrate 102 is thereby avoided.

Figure 5F:
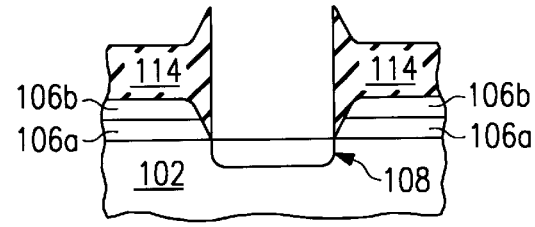

Referring to FIG. 5F, introduction of channel dopants (e.g., by means such as a channel (or Vt) implant or gas immersion laser doping) is performed either before or after the removal of first material 122. Because insulator layer 114 covers raised source/drain regions 106, the introduction of channel dopants is substantially limited to only the immediate channel 108 area. The introduction of channel dopants is self-aligned to the raised source/drain regions 106. This prevents an increase in the capacitance of the subsequently formed source/drain junction region over prior art methods in which the channel implant is not self-aligned to the channel but extends into the source/drain junction regions as well.

Figure 5G:
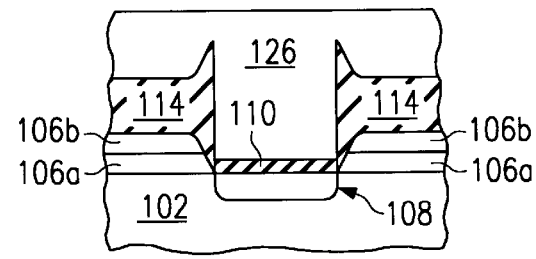
Figure 6:
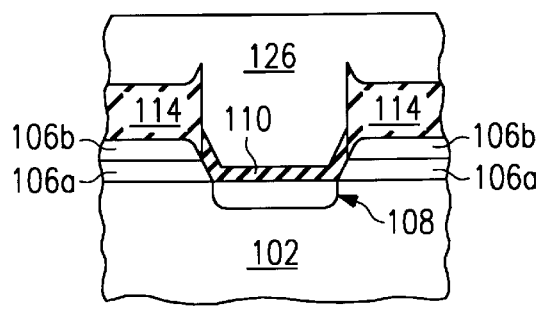
FIG. 6 is a cross-sectional diagram of an alternative embodiment for the MOSFET of FIG. 2 during fabrication.

Next, a gate dielectric 110 is formed followed by the deposition of gate material 126, as shown in FIG. 5G. Gate dielectric 110 may comprise a grown and/or deposited oxide, oxynitride, or any other suitable gate dielectric material including materials with higher dielectric constant than silicon dioxide. If gate dielectric 110 is deposited, then it may be nearly conformal along the vertical edges of insulator 114 as well as on top of insulator layer 114 (not shown). The lateral dimension of the gate material 126 adjacent to the gate dielectric 110 is determined by the opening in insulator material 114 left by the removal of the disposable gate 120. Thus, the actual channel length is not determined by the patterned etch of the gate material 126. The opening left by the removal of disposable gate 120 may be such that the gate dielectric 110 and gate material 126 do or do not extend directly over a portion of the raised source/drain regions 106. FIG. 5G shows the case where the gate dielectric 110/gate material 126 do not extend directly over regions 106 within the space left by the removal of the disposable gate 120. For the case where the gate dielectric 110/gate material 126 do extend over the facets or over the edges of region 106 (in the case of no facet), the gate dielectric 110 in part separates the gate material 126 from the source/drain regions 106, as shown in FIG. 6. Extension of the gate material 126 over regions 106 may be beneficial in reducing series resistance of the subsequently formed MOSFET although an increase in gate-to-drain capacitance will additionally result. The existence and/or optimization of the extension of gate material 126 depends on the application and trade-offs between such issues as the before mentioned series resistance and overlap capacitance.

Gate material 126 may comprise a non-crystalline material substantially containing silicon or silicon-germanium, a doped polysilicon layer, a doped amorphous silicon layer, a metal layer, a composite material comprised of different metals or a combination of metal and semiconductor material, or other appropriate conductive materials (e.g., materials including tungsten, titanium nitride, aluminum, or copper). Additionally, it is noted that if a semiconductor material is utilized in part for the gate material 126, this semiconductor material can be doped in-situ or doped after deposition by means such as implantation and anneal. Doping can be by introduction of n-type dopants (e.g., phosphorus, arsenic or antimony) for an n-type gate material or by p-type dopants (e.g., boron) for a p-type gate material.

Figure 5H:
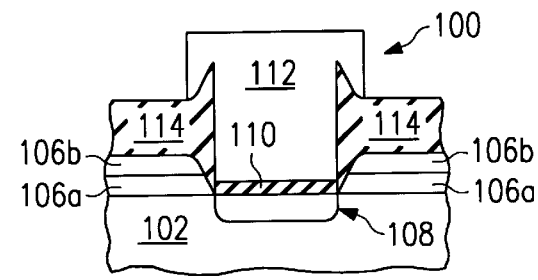

Gate material 126 may then be patterned and etched to form gate electrode 112, as shown in FIG. 5H. By performing the gate processing after source/drain formation, heat treatments required by source/drain formation do not affect the gate dielectric 110 and gate electrode 112. Thus, a doped polysilicon gate electrode can be used with an ultra-thin gate dielectric (i.e., 60 A or even less than 30 A) without having dopant diffuse from the doped polysilicon into the gate dielectric and channel region. Alternatively, a gate electrode comprising, in part, a metal can be used because the heat treatments for the source/drain formation have already been performed.

If desired, a T-gate structure in which the gate electrode extends over a portion of insulator layer 114 may be used to further reduce the gate sheet resistance, as shown in FIG. 5H. In addition, having insulator layer 114 separate the raised source/drain regions 106 from the overlying portions T-gate structure 112 results in a low gate-to-drain capacitance between raised source/drain regions 106 and the overlying portions of T-gate structure 112. Although it offers some advantages, a T-gate structure is not required to practice the invention.

Figure 7:
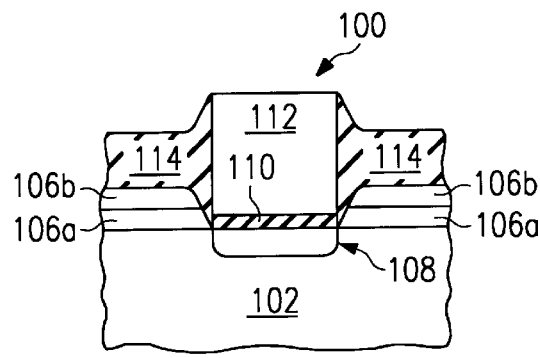
FIG. 7 is a cross-sectional diagram of an alternative embodiment for the MOSFET of FIG. 2 during fabrication.

There are several methods that may be used to form gate electrode 112. As a first example, after deposition, the gate material 126 can be planarized back so that it is substantially even with insulator layer 114 to form a self-aligned non-T-gate structure, as shown in FIG. 7. Subsequently, if desired, a T-gate structure may be formed by means such as a selective epitaxy of semiconductor or metal with the epitaxial overgrowth resulting in a T-gate structure. As a second example, the deposited gate material 126 may simply be patterned and etched to form a T-gate structure extending over a portion of insulator layer 114. In addition, the gate electrode 112 may be cladded by a lower resistance material if desired. Cladding may be accomplished in a number of ways including salicidation, epitaxy of, for example, a metal, or deposition, pattern and etch of a low resistance material.

In a third example, after the gate material 126 is deposited, but before it is etched, a cladding material may be deposited. Then, the cladding material and gate material may be patterned and etched to form a T-gate structure electrode 112. In this case, both the gate material 126 and cladding material of electrode 112 extend over the insulating layer 114.

In a fourth example, a non-T-gate structure may be formed as described above. Subsequently, cladding may be accomplished by depositing a low resistance material (e.g. silicide or metal) and patterning and etching the cladding material such that it extends over a portion of insulator layer 114. In this case, the gate electrode 112 comprises a T-gate structure in which only the cladding layer extends over insulating layer 114.

Subsequent the process flow described above, conventional processes may be used to form connections from the gate electrode 112 and source/drain regions 106 to other devices (not shown). Various modifications to the process described above will be apparent to persons skilled in the art upon reference to the description.

Figure 8A:
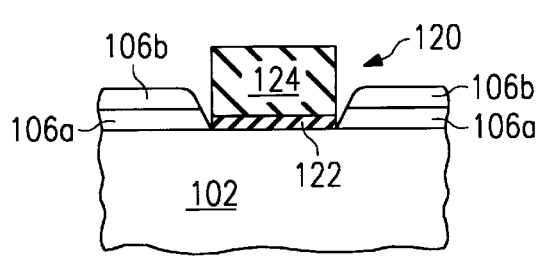
FIGS. 8A–8B are cross-sectional diagrams of an alternative embodiment for the MOSFET of FIG. 2 during fabrication.
Figure 8B:
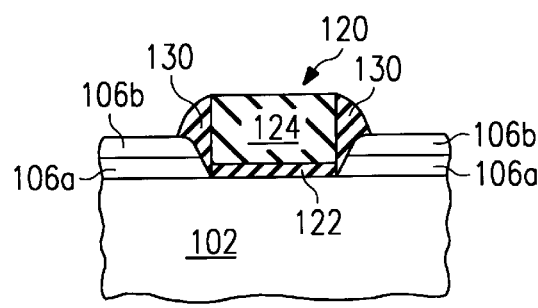

In another modification, deep source/drain regions 132 are utilized. A sidewall spacer 130 is formed on the sidewalls of disposable gate 120 over the facets of raised source/drain regions 106, as shown in FIG. 8A. After the formation of sidewall spacer 130, deeper source/drain regions 132 are formed by, for example, means such as implantation and anneal, as shown in FIG. 8B. Sidewall spacers 130 serve to space the deeper source/drain regions 132 from the subsequently formed gate electrode 112. It should be noted that the anneal to from source/drain regions 104 and/or activate dopants in region 106 may be part of the sidewall spacer 130 formation or the anneal to form the deeper source/drain regions 132 instead of being a separate anneal.

The above mentioned sidewall spacer 130 has several other uses that may be utilized alone or in addition to that described above. Sidewall spacers 130 will then prevent the implantation of dopant into the facets of raised source/drain regions 106. Sidewall spacers 130 can also be used in a process for cladding the raised source/drain regions 106, thereby preventing the cladding in a selected portion of the raised source/drain regions 106. This selected portion may include some, all or more of regions 106 than simply the faceted area. Cladding of the raised source/drain regions 106 can be accomplished using methods similar to those described above with reference to cladding the gate electrode 112. Cladding of the raised source/drain regions 104 should not, however, occur over the entire region 106. Cladding at the ends of the faceted regions should be avoided since a gate dielectric is desired at that region and a thermally grown gate dielectric would not form over a cladded region, and the cladding must not short out layers 106a and 106b in regions 106 adjacent (or nearly adjacent) the gate electrode 112 (subsequently formed).

It should be noted that a disposable gate process is not necessary to practice the invention. A conventional gate structure may also be used. After isolation structures are formed, a gate dielectric is formed over the substrate and a gate electrode material is deposited over the gate dielectric. The gate dielectric and gate electrode material are patterned and etched to form the gate structure as shown in FIG. 8a. Sidewall spacers are then formed on the sidewalls of the gate structure. Raised source/drain regions 106 are then formed as described above, as shown in FIG. 8b.

Those of ordinary skill in the art will realize that many of the options described above may also be used in conjunction with the conventional gate structure. For example, cladding of the gate electrode material and raised source/drain regions 106 may be accomplished.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A lateral MOSFET comprising:
   a barrier layer of a raised source/drain region located over a substrate and comprising a first material;
   an upper layer of said raised source/drain region located over said barrier layer and comprising a second material different from said first material;
   a gate dielectric located adjacent the raised source/drain region and located over a channel region of said substrate, said first material providing an energy band barrier between said raised source/drain region and said channel region; and
   a gate electrode located over said gate dielectric; wherein said gate electrode and gate dielectric are adjacent to a portion of said raised source/drain region, wherein said gate dielectric separates said gate electrode from said raised source/drain region.

2. The MOSFET of claim 1, wherein said upper layer comprises silicon and said barrier layer comprises silicon-carbide.

3. The MOSFET of claim 1, wherein said upper layer comprises silicon and said barrier layer comprises silicon-germanium.

4. The MOSFET of claim 1, wherein said first material provides an energy band barrier between said upper layer and said channel region.

* * * * *